United States Patent
Cho et al.

(10) Patent No.: US 8,390,108 B2
(45) Date of Patent: Mar. 5, 2013

(54) INTEGRATED CIRCUIT PACKAGING SYSTEM WITH STACKING INTERCONNECT AND METHOD OF MANUFACTURE THEREOF

(75) Inventors: NamJu Cho, Uiwang-si (KR); HeeJo Chi, Ichon-si (KR); HanGil Shin, Seongnam-si (KR); Rui Huang, Singapore (SG); Seng Guan Chow, Singapore (SG); Heap Hoe Kuan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 483 days.

(21) Appl. No.: 12/639,984

(22) Filed: Dec. 16, 2009

(65) Prior Publication Data

US 2011/0140259 A1 Jun. 16, 2011

(51) Int. Cl.
*H01L 23/02* (2006.01)
*H01L 23/48* (2006.01)
*H01L 21/50* (2006.01)

(52) U.S. Cl. ........ 257/686; 257/687; 257/778; 438/108; 438/109; 438/123

(58) Field of Classification Search .................. 257/687, 257/777, 778, E23.021, E21.499, 686; 438/123, 438/107–109, 124
See application file for complete search history.

(56) References Cited

U.S. PATENT DOCUMENTS

| | | | |
|---|---|---|---|
| 6,038,133 A * | 3/2000 | Nakatani et al. | 361/760 |
| 6,489,676 B2 | 12/2002 | Taniguchi et al. | |
| 6,812,066 B2 | 11/2004 | Taniguchi et al. | |
| 6,847,109 B2 | 1/2005 | Shim | |
| 7,034,386 B2 | 4/2006 | Kurita | |
| 7,049,528 B2 | 5/2006 | Kariya et al. | |
| 7,185,426 B1 | 3/2007 | Hiner et al. | |
| 7,345,361 B2 | 3/2008 | Mallik et al. | |
| 8,018,034 B2 * | 9/2011 | Chi et al. | 257/660 |
| 2005/0184377 A1 * | 8/2005 | Takeuchi et al. | 257/686 |
| 2007/0164457 A1 * | 7/2007 | Yamaguchi et al. | 257/787 |
| 2008/0073771 A1 | 3/2008 | Seo et al. | |
| 2008/0230887 A1 | 9/2008 | Sun et al. | |
| 2009/0115043 A1 | 5/2009 | Chow et al. | |

OTHER PUBLICATIONS

Ha et al, U.S. Appl. No. 12/325,193, filed Nov. 29, 2008.
Ha et al, U.S. Appl. No. 12/412,886, filed Mar. 27, 2009.
Pagaila et al, U.S. Appl. No. 12/488,089, filed Jun. 19, 2009.
Choi et al, U.S. Appl. No. 12/557,481, filed Sep. 10, 2009.

* cited by examiner

*Primary Examiner* — Michael Trinh
(74) *Attorney, Agent, or Firm* — Ishimaru & Associates LLP; Mikio Ishimaru

(57) ABSTRACT

A method of manufacture of an integrated circuit packaging system includes: fabricating a base package substrate; coupling a conductive column lead frame to the base package substrate by: providing a lead frame support, patterning a conductive material on the lead frame support including forming an interconnect securing structure, and coupling the conductive material to the base package substrate; forming a base package body between the base package substrate and the conductive column lead frame; and removing the lead frame support from the conductive column lead frame for exposing the interconnect securing structure from the base package body.

19 Claims, 5 Drawing Sheets

INTEGRATED CIRCUIT PACKAGING SYSTEM WITH STACKING INTERCONNECT AND METHOD OF MANUFACTURE THEREOF

CROSS-REFERENCE TO RELATED APPLICATION(S)

The present application contains subject matter related to U.S. patent application Ser. No. 12/488,089 filed Jun. 19, 2009, now U.S. Pat. No. 7,927,917. The related application is assigned to STATS ChipPAC Ltd. and the subject matter thereof is incorporated herein by reference thereto.

TECHNICAL FIELD

The present invention relates generally to an integrated circuit packaging system, and more particularly to a system for stacking integrated circuit packages.

BACKGROUND ART

The electronic industry continues to seek products that are lighter, faster, smaller, multi-functional, more reliable and more cost-effective. The advent of multi-function electronic devices, such as cell phones that are also game platforms, cameras, Internet portals, and music or video players, has brought immense pressure on the electronics device manufacturers and the manufacturing companies that support them.

In an effort to meet such requirements, package assembly techniques have been developed for multi-chip packages (MCP) and chip stack packages. These types of packages combine two or more semiconductor chips in a single package, thereby realizing increased memory density, multi-functionality and/or reduced package footprint.

The use of several chips in a single package does, however, tend to reduce both reliability and yield. During post assembly testing, if just one chip in the multi-chip or chip stack package fails to meet the functional or performance specifications, the entire package fails, causing the good chip(s) to be discarded along with the failing chip. As a result, multi-chip and chip stack package tend to lower the productivity from the assembly process.

A 3-dimensional package stack addresses this yield problem by stacking several assembled packages that each contain a single chip and that have already passed the necessary tests, thereby improving the yield and reliability of the final composite package. However, package stacks have tended to use lead frame type packages rather than area array type packages. Lead frame type packages typically utilize edge-located terminals such as outer leads, whereas area array type packages typically utilize surface-distributed terminals such as solder balls. Area array type package may therefore provide larger terminal counts and/or smaller footprints when compared with corresponding lead frame type packages.

Attempts to form area array type packages have met with other difficulties. Positioning of the contacts within the array and alignment between the two stacked interfaces has proved a daunting problem. As the number of interface contacts increases the critical alignment between the integrated circuit package interfaces becomes even more challenging.

Thus, a need still remains for an integrated circuit packaging system with stacking interconnects, in order to meet the volume and performance needs of the electronic devices industry. In view of the public demand for smaller devices with more function, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: fabricating a base package substrate; coupling a conductive column lead frame to the base package substrate by: providing a lead frame support, patterning a conductive material on the lead frame support including forming an interconnect securing structure, and coupling the conductive material to the base package substrate; forming a base package body between the base package substrate and the conductive column lead frame; and removing the lead frame support from the conductive column lead frame for exposing the interconnect securing structure from the base package body.

The present invention provides an integrated circuit packaging system including: a base package substrate; a conductive column having an interconnect securing structure coupled to the base package substrate; and a base package body on the base package substrate with the conductive column and the interconnect securing structure exposed on a top surface.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
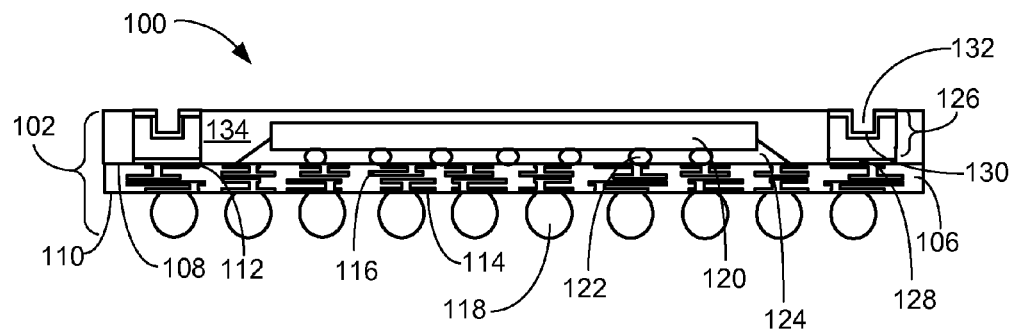
FIG. 1 is a cross-sectional view of an integrated circuit packaging system with stacking interconnects in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described, each having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements with no intervening material.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit packaging system 100 with stacking interconnects in an embodiment of the present invention. The cross-sectional view of the integrated circuit packaging system 100 depicts a base package 102.

The base package 102 includes a base package substrate 106, having a component side 108 and a system side 110. Component pads 112 on the component side 108 may be coupled to system pads 114 on the system side 110 by internal wiring 116, such as traces, vias, or a combination thereof. System interconnects 118, such as solder bumps, solder balls, solder columns, or stud bumps, may be formed on the system pads 114 in order to couple to the next level system, not shown.

A base integrated circuit die 120 may be coupled to the component pad 112 by chip interconnects 122, such as solder bumps, solder balls, or bond wires. A sealing adhesive 124, such as an underfill material or a die attach material, may be applied between the component side 108 and the base integrated circuit die 120 to enclose the chip interconnects 122 in order to protect them from moisture or fracture due to shock.

The base integrated circuit die 120 is shown as a flip chip die, but this is an example only and other die configurations are possible. In other configurations of the base integrated circuit die 120, the sealing adhesive 124 may be a die attach material.

Conductive columns 126 may be attached to the component pads 112 by a conductive adhesive 128, such as solder or conductive epoxy, or by thermal compression bonding. The conductive columns 126 may include a seed layer 130, such as a solder wettable layer or a temporary adhesive layer, deposited as part of the conductive columns 126 to form an interconnect securing structure 132 in the top of the conductive columns 126.

A base package body 134 may be formed of an encapsulant, such as epoxy molding compound or ceramic, on the component side 108, the base integrated circuit die 120, the sealing adhesive 124, and the conductive columns 126. The base package body 134 leaves the seed layer 130 and the interconnect securing structure 132 exposed on a top surface.

Figure 2:
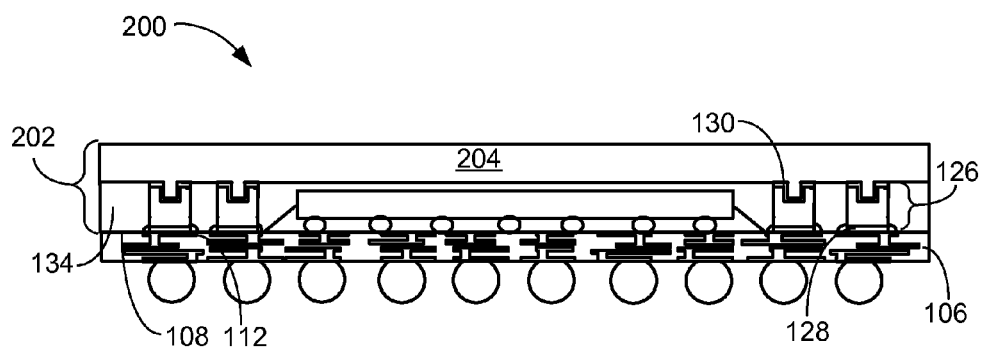
FIG. 2 is a cross-sectional view of a base package with the stacking interconnects in a molding phase of manufacture.

Referring now to FIG. 2, therein is shown a cross-sectional view of a base package 200 with the stacking interconnects in a molding phase of manufacture. The cross-sectional view of the base package 200 depicts the base package substrate 106 having a conductive column lead frame 202 coupled to the component pads 112 by the conductive adhesive 128. The base package body 134 may be formed by filling the space between the component side 108, of the base package substrate 106, and a lead frame support 204.

It has been discovered that the position and alignment of the conductive columns 126 relative to the component pads 112 may be assured by the application of the conductive column lead frame 202 on the component side 108 of the base package substrate 106. Also by having the lead frame support 204 in place during the molding process, the integrity of the electrical connection to the component pads 112 and the location of the conductive columns 126 is maintained by the base package body 134.

It has also been discovered that multiple rows of the conductive columns 126 may be coupled to the component pads 112 with great precision and providing better control of the package alignment during the stacking process. In the example shown two rows of the conductive columns 126 are coupled to the component pads 112, but it is understood that a different number of rows may be used for the base package 200.

It has been discovered that the lead frame support 204 may be removed from the base package 200 by means of etching, grinding, mechanical peel, or a combination thereof. The seed layer 130 may act as an etch stop layer or it may provide a separation point for the mechanical peel process.

Figure 3:
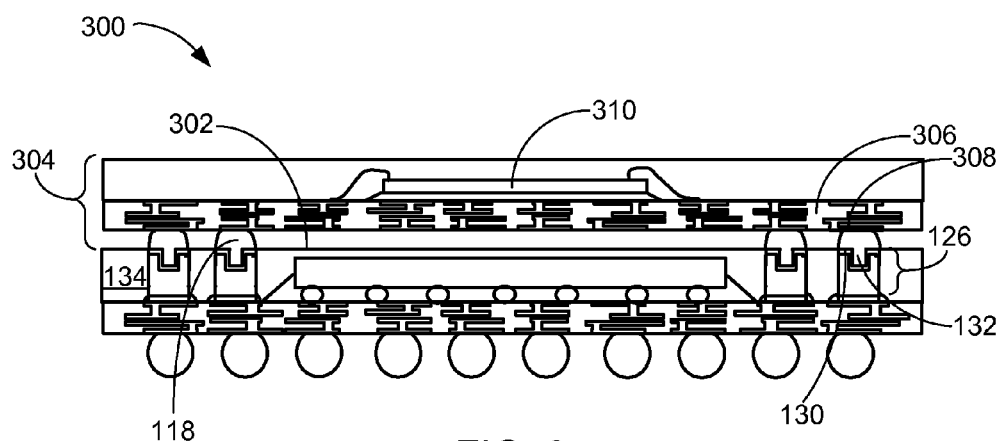
FIG. 3 is a cross-sectional view of an integrated circuit packaging system with the stacking interconnects in a stacked package.

Referring now to FIG. 3, therein is shown a cross-sectional view of an integrated circuit packaging system 300 with the stacking interconnects in a stacked package. The cross-sectional view of the integrated circuit packaging system 300 depicts the conductive columns 126 held in precise place by the base package body 134. The lead frame support 204, of FIG. 2, having been removed to leave the seed layer 130 and the interconnect securing structure 132 of each of the conductive columns 126 exposed from a top surface 302 of the base package 300.

A stacked package 304 may be of any package configuration. The stacked package 304 may have a stacked substrate 306 that includes interconnect pads 308. The interconnect pads 308 may be coupled to the conductive columns 126 by the system interconnects 118. A stacked integrated circuit die 310 may be coupled to the base integrated circuit die 120, the system interconnects 118, or a combination thereof, through the conductive columns 126.

It has been discovered that the conductive columns 126 having the interconnect securing structure 132 may provide a reliable stacking interconnect without alignment problems experienced by the prior art interconnects. The seed layer 130 in combination with the interconnect securing structure 132 assures proper alignment and connection by drawing the system interconnects 118 of the stacked package 304 into the interconnect securing structure during the reflow process.

Figure 4:
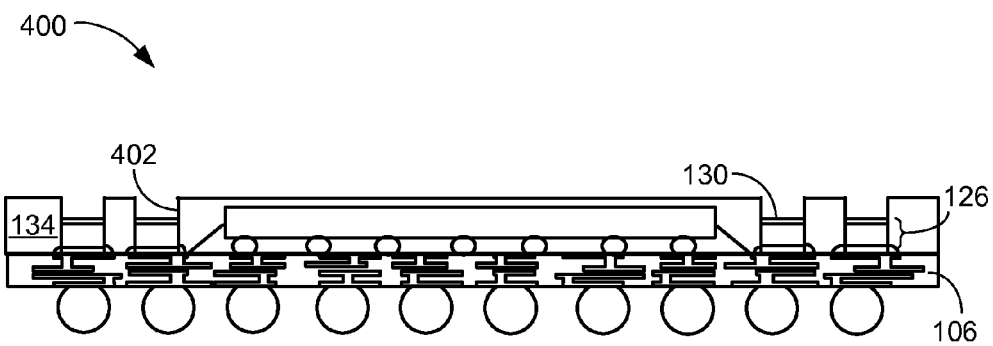
FIG. 4 is a cross-sectional view of an integrated circuit packaging system with stacking interconnects in a first alternative embodiment of the present invention.

Referring now to FIG. 4, therein is shown a cross-sectional view of an integrated circuit packaging system 400 with stacking interconnects in a first alternative embodiment of the present invention. The cross-sectional view of the integrated circuit packaging system 400 depicts the conductive columns 126, coupled to the base package substrate 106, recessed within the base package body 134.

The seed layer 130 may be recessed within the base package body 134 to form an interconnect securing structure 402 provided by the base package body 134. The position and alignment of the conductive columns 126 may be assured by using the conductive column lead frame 202, of FIG. 2.

Figure 5:
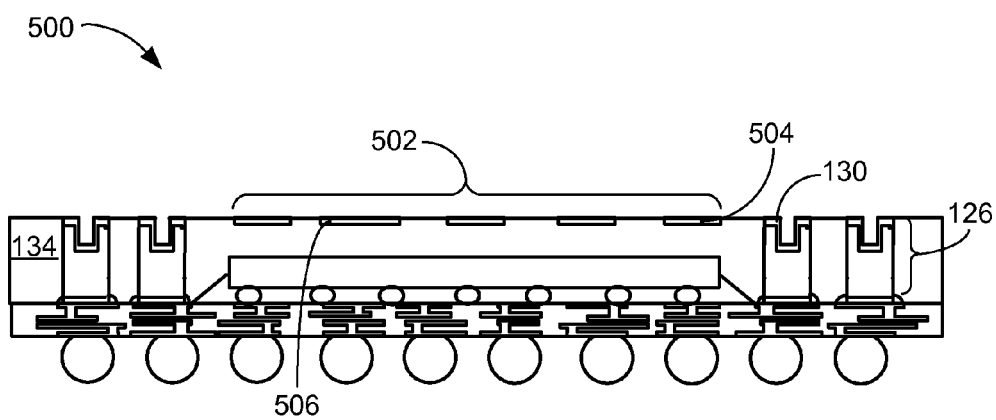
FIG. 5 is a cross-sectional view of an integrated circuit packaging system with stacking interconnects in a second alternative embodiment of the present invention.

Referring now to FIG. 5, therein is shown a cross-sectional view of an integrated circuit packaging system 500 with stacking interconnects in a second alternative embodiment of the present invention. The a cross-sectional view of the integrated circuit packaging system 500 depicts the conductive columns 126 aligned in rows about the periphery of the integrated circuit packaging system 500 having an array of contact pads 502 formed in the top surface of the base package body 134.

It has been discovered that the array of contact pads 502 may be formed by patterning the seed layer 130 on the lead frame support 204, of FIG. 2. The array of contact pads 502, formed of the seed layer 130, may include contacts 504 and interconnect traces 506 applied to the lead frame support 204 prior to the formation of the base package body 134. The process used to separate the lead frame support 204 from the integrated circuit packaging system 500 would leave the array of contact pads 502 and the conductive columns exposed on the top surface to the integrated circuit packaging system 500.

Figure 6:
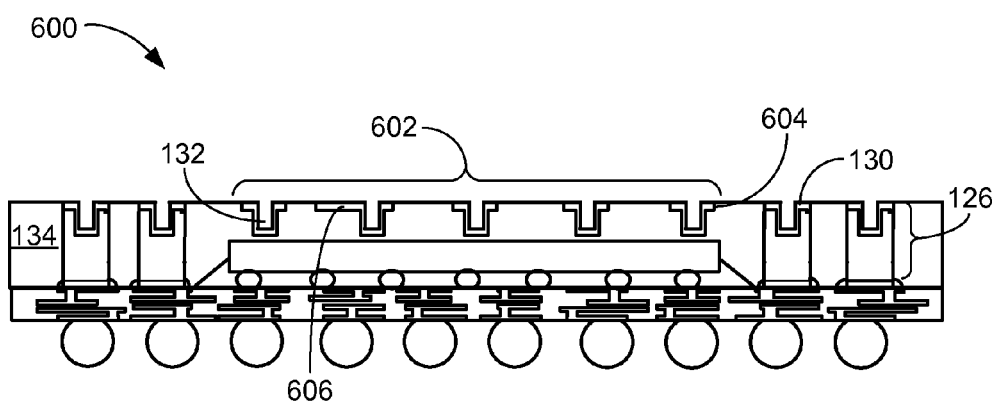
FIG. 6 is a cross-sectional view of an integrated circuit packaging system with stacking interconnects in a third alternative embodiment of the present invention.

Referring now to FIG. 6, therein is shown a cross-sectional view of an integrated circuit packaging system 600 with stacking interconnects in a third alternative embodiment of the present invention. The cross-sectional view of the integrated circuit packaging system 600 depicts an array of secure contacts 602 includes the seed layer 130 with the interconnect securing structure 132 formed therein.

The array of secure contacts 602 may be formed by the same process described for the array of contact pads 502, of FIG. 5. Secure contact pads 604 and interconnect traces 606 necessary for coupling the array of secure contacts 602 may also be patterned on the lead frame support 204, of FIG. 2.

Figure 7:
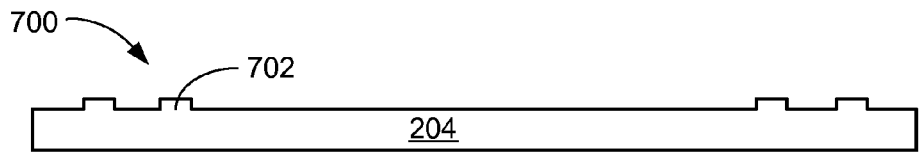
FIG. 7 is a cross-sectional view of a conductive post frame base in an embodiment of the present invention.

Referring now to FIG. 7, therein is shown a cross-sectional view of a conductive post frame base 700 in an embodiment of the present invention. The cross-sectional view of the conductive post frame base 700 depicts the lead frame support 204 having secure interconnect forms 702 applied thereon.

The secure interconnect forms 702 may be patterned by etching, machining, deposition, adhering, or a combination thereof. It has been discovered that the precise location of the secure interconnect forms 702 may mirror the design of the component side 108, of FIG. 1, of the base package substrate 106, of FIG. 1 and may be developed from the same data base.

Figure 8:
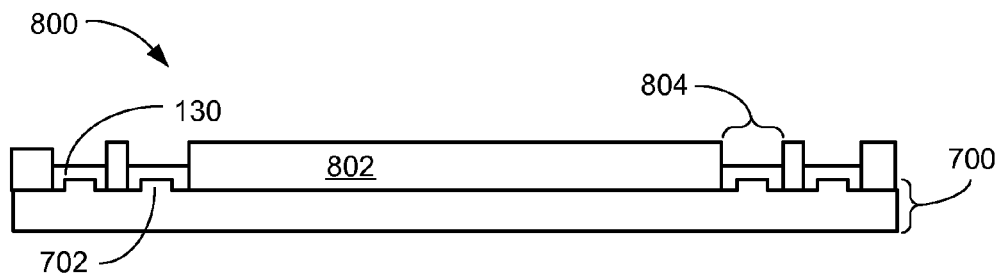
FIG. 8 is a cross-sectional view of a conductive post frame in a seed layer deposition phase of manufacturing.

Referring now to FIG. 8, therein is shown a cross-sectional view of a conductive post frame 800 in a seed layer deposition phase of manufacturing. The cross-sectional view of the conductive post frame 800 depicts the conductive post frame base 700 with a resist layer 802 patterned thereon.

The patterning of the resist layer 802 may provide a space around the secure interconnect forms 702. The seed layer 130 may be deposited in patterned openings 804 of the resist layer 802.

Figure 9:
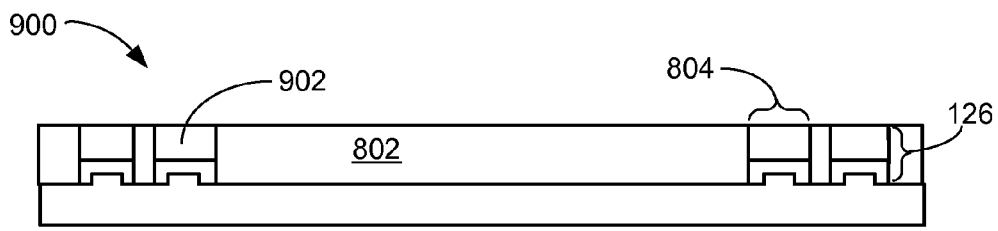
FIG. 9 is a cross-sectional view of a conductive post lead frame in the conductive post deposition phase of manufacturing.

Referring now to FIG. 9, therein is shown a cross-sectional view of a conductive post lead frame 900 in the conductive post 126 deposition phase of manufacturing. The cross-sectional view of the conductive post lead frame 900 depicts the conductive columns 126 formed by depositing a conductive material 902, such as Copper (Cu), Tin (Sn), Aluminum (Al), or an alloy thereof, to fill the patterned openings 804 in the resist layer 802.

Figure 10:
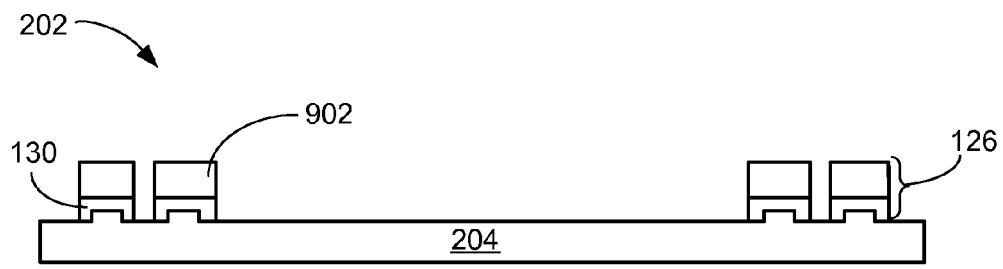
FIG. 10 is a cross-sectional view of the conductive column lead frame in a mask layer removal phase of manufacturing.

Referring now to FIG. 10, therein is shown a cross-sectional view of the conductive column lead frame 202 in a mask layer removal phase of manufacturing. The cross-sectional view of the conductive column lead frame 202 depicts the lead frame support 204 having the conductive columns 126 formed thereon.

It has been discovered that by carefully choosing dissimilar metals for the lead frame support 204 and the seed layer 130, a simplified disconnect process may be utilized after the base package body 134, of FIG. 1, supports the conductive columns 126. Also by careful selection of the conductive material 902 a solid and reliable connection may be provided. The precise locations and dimensions of the conductive columns 126 may be developed from the construction database for the base package substrate 106, of FIG. 1.

Figure 11:
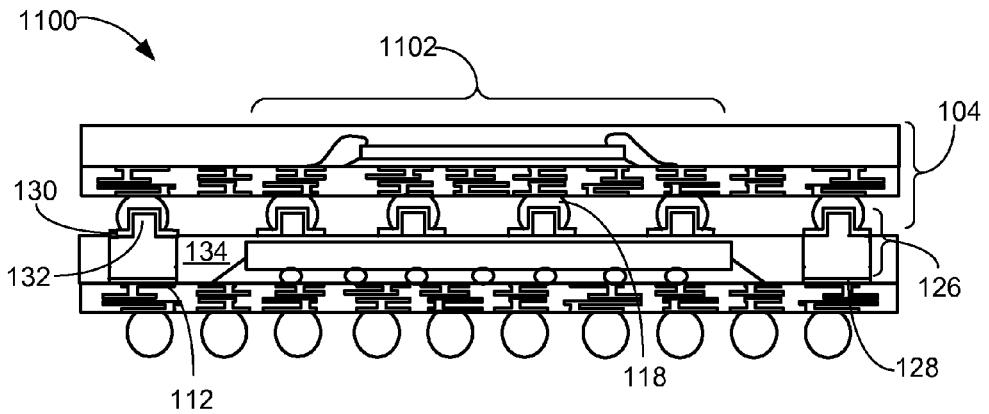
FIG. 11 is a cross-sectional view of an integrated circuit packaging system with stacking interconnects in a fourth alternative embodiment of the present invention.

Referring nor to FIG. 11, therein is shown a cross-sectional view of an integrated circuit packaging system 1100 with stacking interconnects in a fourth alternative embodiment of the present invention. The cross-sectional view of the integrated circuit packaging system 1100 depicts the conductive columns 126 attached to the component pads 112 by the conductive adhesive 128, such as solder or conductive epoxy. The conductive columns 126 may include the seed layer 130, such as a solder wettable layer, deposited as part of the conductive columns 126 to form the interconnect securing structure 132 in the top of the conductive columns 126.

The interconnect securing structure 132 of this embodiment extends above the base package body 134 and includes the seed layer 130 covering the interconnect securing structure 132. The interconnect securing structure 132 of this embodiment may be used to control the collapse height of the system interconnects 118 of the stacked package 304.

An array of secure contacts 1102 may extend across the upper surface of the base package body 134. It has been discovered that the array of secure contacts 1102 may provide additional package reliability and prevent warping of the stacked package 304.

Figure 12:
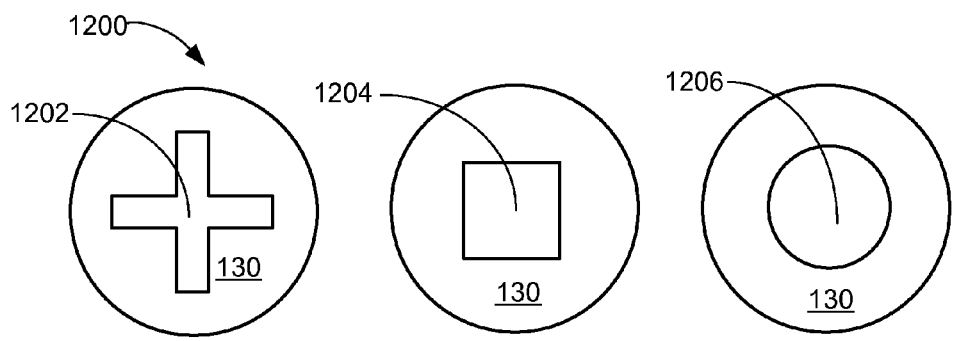
FIG. 12 is a top view of interconnect securing structures.

Referring now to FIG. 12, therein is shown a top view of interconnect securing structures 1200. The view of the interconnect securing structures 1200 depicts an interconnect securing cross 1202, an interconnect securing rectangle 1204, and an interconnect securing cylinder 1206.

While these shapes are for an example only, other advantageous shapes may be used to help establish the interconnect securing structure 132, of FIG. 1 and FIG. 11, for providing the right support for the application. It is further understood that the shapes of the interconnect securing cross 1202, the interconnect securing rectangle 1204, and the interconnect securing cylinder 1206 may either be recessed into the conductive column 126, of FIG. 1, or protrude from the conductive column 126 as best suits the application. The seed layer 130, of FIG. 1 and FIG. 11, will provide a solder wettable surface to assure a reliable connection.

Figure 13:
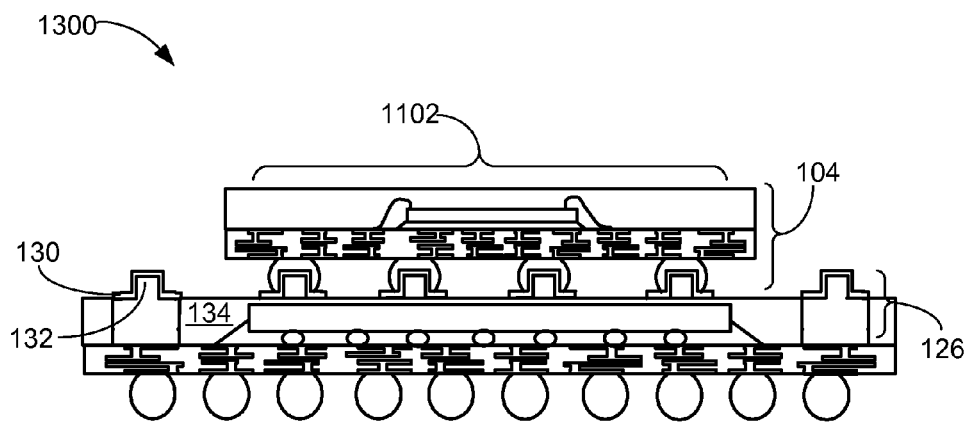
FIG. 13 is a cross-sectional view of an integrated circuit packaging system with stacking interconnects in a fifth alternative embodiment of the present invention.

Referring now to FIG. 13, therein is shown a cross-sectional view of an integrated circuit packaging system 1300 with stacking interconnects in a fifth alternative embodiment of the present invention. The cross-sectional view of the integrated circuit packaging system 1300 depicts the stacked package 304 coupled to the array of secure contacts 1102 while leaving the conductive columns 126 at the periphery of the integrated circuit packaging system 1300 available for test connection or further stacking of additional packages.

The conductive column 126 having the interconnect securing structure 132 coated by the seed layer 130 is shown to be coplanar with the array of secure contacts 1102, but this is an example only and the actual implementation may differ. The conductive column 126 must have the base package body 134 for support and location.

Figure 14:
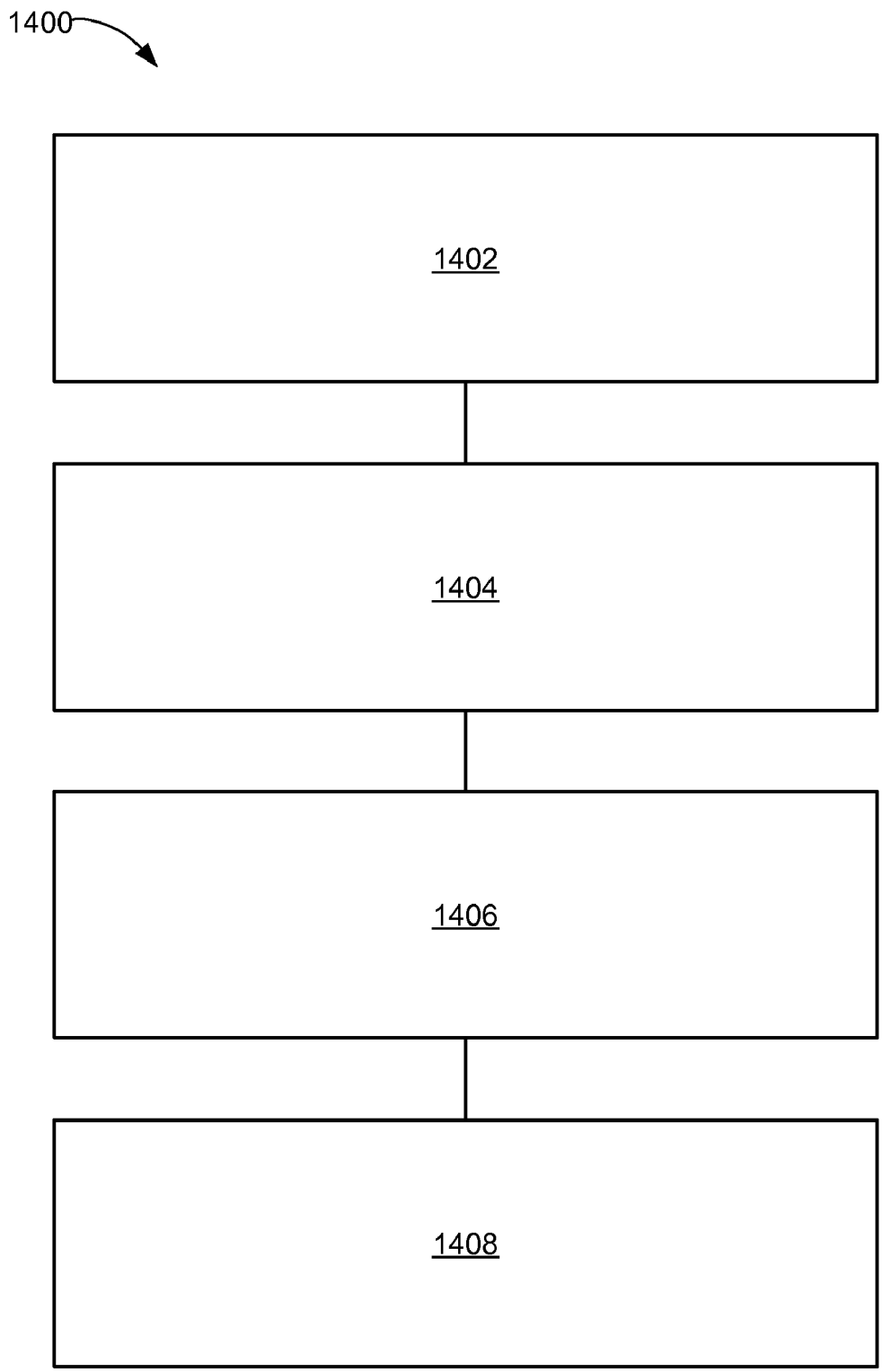
FIG. 14 is a flow chart of a method of manufacture of an integrated circuit packaging system in an embodiment of the present invention.

Referring now to FIG. 14, therein is shown a flow chart of a method 1400 of manufacture of the integrated circuit packaging system 100 in an embodiment of the present invention. The method 1400 includes: fabricating a base package substrate in a block 1402; coupling a conductive column lead frame to the base package substrate by: providing a lead frame support, patterning a conductive material on the lead frame support includes forming an interconnect securing structure, and coupling the conductive material to the base package substrate in a block 1404; forming a base package body between the base package substrate and the conductive column lead frame in a block 1406; and removing the lead frame support from the conductive column lead frame for exposing the interconnect securing structure from the base package body in a block 1408.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems with stacking interconnects fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   fabricating a base package substrate having a system pad on a system side coupled to a component pad on a component side;
   coupling a conductive column lead frame to the component pad of the base package substrate by:
   providing a lead frame support,
   patterning a conductive material on the lead frame support including forming an interconnect securing structure, and
   coupling the conductive material to the base package substrate;
   forming a base package body of an encapsulation molded between the base package substrate and the conductive column lead frame;
   removing the lead frame support from the conductive column lead frame for exposing the interconnect securing structure from the base package body; and
   coupling a stacked integrated circuit die in a stacked package to the system pad through the conductive column.

2. The method as claimed in claim 1 further comprising forming an array of contact pads on the base package body.

3. The method as claimed in claim 1 wherein removing the lead frame support from the conductive column lead frame includes performing an etching, a machining, or a mechanical peel to expose a seed layer.

4. The method as claimed in claim 1 further comprising forming an array of secure contacts on the base package body including forming a secure contact pad on the lead frame support.

5. The method as claimed in claim 1 further comprising reflowing a system interconnect on a seed layer and over the interconnect securing structure includes a conductive column having the interconnect securing structure protruding from or recessed into a conductive material.

6. A method of manufacture of an integrated circuit packaging system comprising:
   fabricating a base package substrate having component pads on a component side coupled to system interconnects on a system side;
   coupling a conductive column lead frame to the component pads by:
   providing a lead frame support,
   patterning a seed layer on the lead frame support including forming an interconnect securing structure,
   depositing a conductive material on the seed layer, and
   coupling the conductive material to the component pad includes a conductive adhesive between the component pads and the conductive material;
   forming a base package body between the base package substrate and the conductive column lead frame by molding an encapsulation on the conductive column lead frame;
   removing the lead frame support from the conductive column lead frame for exposing the seed layer on the interconnect securing structure from the base package body; and
   coupling a stacked integrated circuit die in a stacked package to the system pad through the conductive column.

7. The method as claimed in claim 6 further comprising forming an array of contact pads on the base package body includes patterning a contact and an interconnect trace by the seed layer deposited on the conductive column lead frame.

8. The method as claimed in claim 6 wherein removing the lead frame support from the conductive column lead frame includes performing an etching, a machining, or a mechanical peel to expose the seed layer includes a dissimilar metal used in the lead frame support as compared to the seed layer.

9. The method as claimed in claim 6 further comprising forming an array of secure contacts on the base package body including:
   forming a secure contact pad on the lead frame support; and
   forming interconnect traces coupled to the secure contact pad by patterning the seed layer.

10. The method as claimed in claim 6 wherein reflowing the system interconnect on the seed layer and over the interconnect securing structure includes a conductive column having the interconnect securing structure protruding from or recessed into a conductive material by forming an interconnect securing cross, an interconnect securing rectangle, or an interconnect securing cylinder.

11. An integrated circuit packaging system comprising:
   a base package substrate having a system pad on a system side coupled to a component pad on a component side;
   a conductive column having an interconnect securing structure coupled to the component pad of the base package substrate by a conductive adhesive;
   a base package body formed of an encapsulation molded on the conductive column and the base package substrate with the conductive column and the interconnect securing structure exposed on a top surface; and
   a stacked integrated circuit die in a stacked package coupled to the system pad through the conductive column.

12. The system as claimed in claim 11 further comprising an array of contact pads on the top surface of the base package body.

13. The system as claimed in claim 11 further comprising:
   component pads on the base package substrate; and
   a base integrated circuit die coupled to the component pads.

14. The system as claimed in claim 11 further comprising an array of secure contacts on the base package body.

15. The system as claimed in claim 11 wherein the conductive column exposed on the top surface of the base package body includes a seed layer formed on the interconnect securing structure.

16. The system as claimed in claim 11 further comprising an array of contact pads on the top surface of the base package body includes a contact pad formed of a seed layer exposed on the top surface of the base package body.

17. The system as claimed in claim 11 further comprising a base integrated circuit die coupled to the component pads on the base package substrate includes chip interconnects between the base integrated circuit die and the component pads.

18. The system as claimed in claim 11 further comprising an array of secure contacts on the base package body includes a seed layer on an interconnect securing structure forms a secure contact pad.

19. The system as claimed in claim 11 further comprising a base integrated circuit die in the base package coupled to the stacked integrated circuit die, through the conductive columns, the system pads, or a combination thereof includes the conductive columns having an interconnect securing cross, an interconnect securing rectangle, or an interconnect securing cylinder.

* * * * *